(12) United States Patent
Cho et al.

(10) Patent No.: US 7,928,552 B1
(45) Date of Patent: Apr. 19, 2011

(54) INTEGRATED CIRCUIT PACKAGING SYSTEM WITH MULTI-TIER CONDUCTIVE INTERCONNECTS AND METHOD OF MANUFACTURE THEREOF

(75) Inventors: NamJu Cho, Uiwang-si (KR); HeeJo Chi, Ichon-si (KR); HanGil Shin, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 12/722,759

(22) Filed: Mar. 12, 2010

(51) Int. Cl.
*H01L 23/522* (2006.01)
(52) U.S. Cl. ................................. 257/686; 257/E23.142
(58) Field of Classification Search .......... 257/686–690, 257/777, 23.142
See application file for complete search history.

(56) References Cited

U.S. PATENT DOCUMENTS

| | | | |
|---|---|---|---|
| 5,371,654 A | 12/1994 | Beaman et al. | |
| 5,579,207 A | 11/1996 | Hayden et al. | |
| 7,489,044 B2 | 2/2009 | Pu et al. | |
| 2005/0184377 A1* | 8/2005 | Takeuchi et al. | 257/686 |
| 2007/0235215 A1 | 10/2007 | Bathan et al. | |
| 2007/0246813 A1 | 10/2007 | Ong et al. | |
| 2008/0006942 A1 | 1/2008 | Park et al. | |
| 2008/0042251 A1* | 2/2008 | Weng et al. | 257/686 |
| 2008/0128882 A1* | 6/2008 | Baek et al. | 257/686 |
| 2008/0142940 A1* | 6/2008 | Dunne | 257/686 |
| 2010/0025833 A1 | 2/2010 | Pagaila et al. | |
| 2010/0025836 A1* | 2/2010 | Tay et al. | 257/686 |

OTHER PUBLICATIONS

U.S. Appl. No. 12/325,193, filed Nov. 29, 2008, Ha et al.
U.S. Appl. No. 12/488,089, filed Jun. 19, 2009, Pagaila et al.
U.S. Appl. No. 12/412,886, filed Mar. 27, 2009, Ha et al.
U.S. Appl. No. 12/722,852, filed Mar. 12, 2010, Cho et al.

* cited by examiner

*Primary Examiner* — Nathan W Ha
(74) *Attorney, Agent, or Firm* — Mikio Ishimaru

(57) ABSTRACT

A method of manufacture of an integrated circuit packaging system includes: providing a carrier having a planar surface and a cavity therein, a first barrier between the planar surface and a first interconnect, and a second barrier between the cavity and a second interconnect; providing a substrate; mounting an integrated circuit over the substrate; mounting the carrier to the substrate with the first interconnect and the second interconnect attached to the substrate and with the planar surface over the integrated circuit; forming an encapsulation between the substrate and the carrier covering the integrated circuit, the encapsulation having an encapsulation recess under the planar surface and over the integrated circuit; and removing a portion of the carrier to expose the encapsulation, a portion of the first barrier to form a first contact pad, and a portion of the second barrier to form a second contact pad.

10 Claims, 7 Drawing Sheets

INTEGRATED CIRCUIT PACKAGING SYSTEM WITH MULTI-TIER CONDUCTIVE INTERCONNECTS AND METHOD OF MANUFACTURE THEREOF

CROSS-REFERENCE TO RELATED APPLICATION

The present application contains subject matter related to a concurrently filed U.S. Patent Application by NamJu Cho, HeeJo Chi, and HanGil Shin entitled "Carrier System with Multi-tier Conductive Posts and Method of Manufacture Thereof". The related application is assigned to STATS Chip-PAC Ltd. and is identified by Ser. No. 12/722,852. The subject matter thereof is incorporated herein by reference thereto.

TECHNICAL FIELD

The present invention relates generally to an integrated circuit packaging system, and more particularly to a system for an integrated circuit packaging system with multi-tier conductive interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made using the semiconductor package structures. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package-on-package (POP). POP designs face reliability challenges and higher cost.

Thus, a need still remains for an integrated circuit packaging system improved yield, low profile, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a carrier having a planar surface and a cavity therein, a first barrier between the planar surface and a first interconnect, and a second barrier between the cavity and a second interconnect; providing a substrate; mounting an integrated circuit over the substrate; mounting the carrier to the substrate with the first interconnect and the second interconnect attached to the substrate and with the planar surface over the integrated circuit; forming an encapsulation between the substrate and the carrier covering the integrated circuit, the encapsulation having an encapsulation recess under the planar surface and over the integrated circuit; and removing a portion of the carrier to expose the encapsulation, a portion of the first barrier to form a first contact pad, and a portion of the second barrier to form a second contact pad.

The present invention provides an integrated circuit packaging system including: a substrate; an integrated circuit over the substrate; a first interconnect attached to the substrate; a second interconnect attached to the substrate; an encapsulation having an encapsulation recess and an encapsulation plateau covering the first interconnect, the second interconnect, and the integrated circuit with the encapsulation recess over the integrated circuit, the first interconnect under the encapsulation recess, and the second interconnect under the encapsulation plateau; a first contact pad exposed along the encapsulation recess and attached to the first interconnect; and a second contact pad exposed along the encapsulation plateau and attached to the second interconnect.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
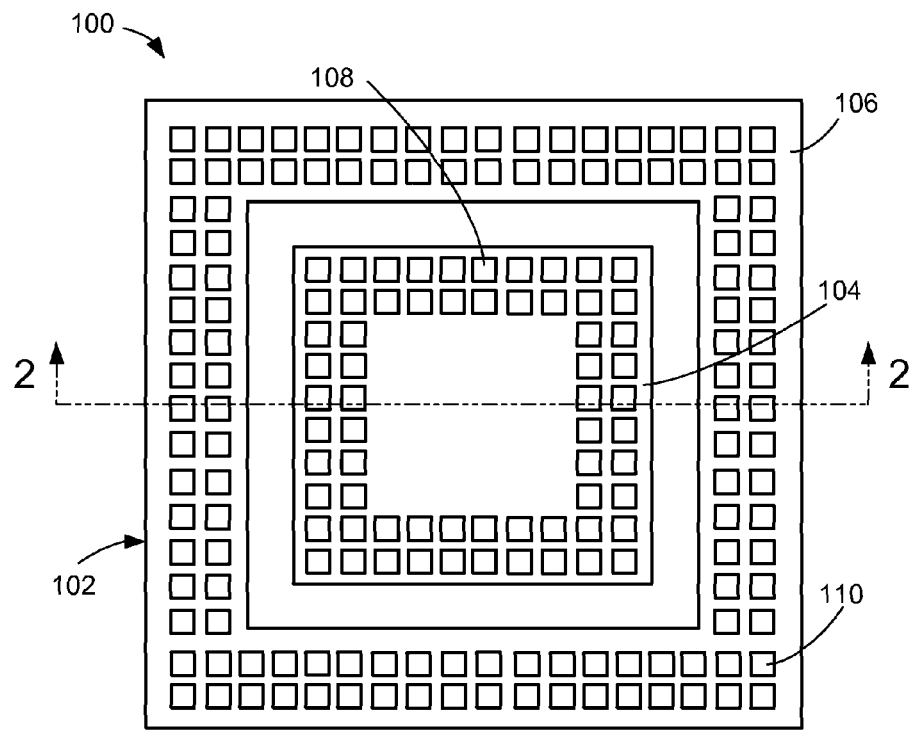
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact between elements. The term "processing" as used herein includes deposition of material, patterning, exposure, development, etching, cleaning, molding, and/or removal of the material or as required in forming a described structure.

Referring now to FIG. 1, therein is shown a top view of an integrated circuit packaging system 100 in a first embodiment of the present invention. The top view depicts an encapsulation 102, such as a cover including an epoxy molding compound or a wire in film. The encapsulation 102 can include an encapsulation recess 104 and an encapsulation plateau 106. The encapsulation recess 104 can be an inner portion of the encapsulation 102. The encapsulation plateau 106 can be along a peripheral portion of the encapsulation 102. As an example, the encapsulation plateau 106 is shown surrounding the encapsulation recess 104.

First contact pads 108 can be exposed from the encapsulation recess 104. The first contact pads 108 can be along an outer portion of the encapsulation recess 104. Second contact pads 110 can be exposed from the encapsulation plateau 106.

For illustrative purposes, the integrated circuit packaging system 100 is shown having the first contact pads 108 in a dual row configuration, although it is understood that the first contact pads 108 can have a different configuration. For example, the integrated circuit packaging system 100 can have the first contact pads 108 in a single row or triple row configuration. As a further example, the integrated circuit packaging system 100 can have the first contact pads 108 in a staggered configuration.

For further illustrative purposes, the integrated circuit packaging system 100 is shown having the second contact pads 110 in a dual row configuration, although it is understood that the first contact pads 108 can have a different configuration. For example, the integrated circuit packaging system 100 can have the second contact pads 110 in a single row or triple row configuration. As a further example, the integrated circuit packaging system 100 can have the second contact pads 110 in a staggered configuration.

Figure 2:
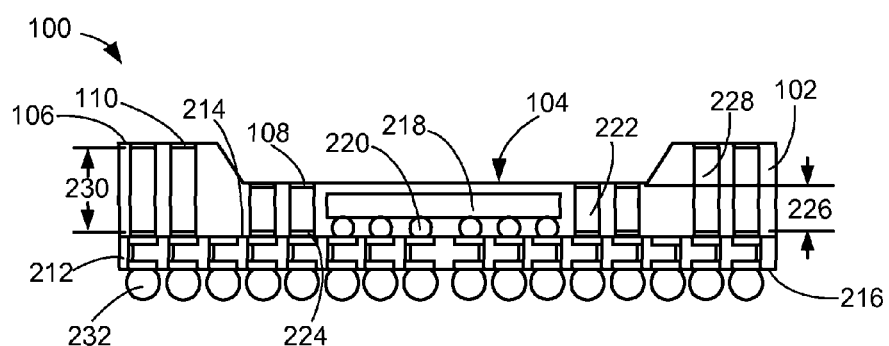
FIG. 2 is a cross-sectional view of the integrated circuit packaging system along line 2-2 of FIG. 1.

Referring now to FIG. 2, therein is shown a cross-sectional view of the integrated circuit packaging system 100 along line 2-2 of FIG. 1. The cross-sectional view depicts a substrate 212, such as a laminated substrate or a chip carrier, having a substrate first side 214 and a substrate second side 216. An integrated circuit 218, such as a flip chip or an integrated circuit die, can be mounted over the substrate first side 214. Internal interconnects 220, such as solder balls or conductive bumps, can connect the integrated circuit 218 and the substrate 212.

A first interconnect 222, such as a conductive interconnect or pillar made from copper or a conductive alloy, can be attached to the substrate 212 with interface interconnects 224, such as a solder pad or a conductive pad. The first interconnect 222 can be adjacent to the integrated circuit 218 and below the encapsulation recess 104. The first interconnect 222 can have a first interconnect height 226.

The first contact pads 108 can be connected to the first interconnect 222 on a side facing away from the substrate 212. The first contact pads 108 can be formed from a material different from the material used to form the first interconnect 222. For example, the first contact pads 108 can be made from conductive materials including aluminum, nickel/silver, or silver/gold alloys.

A second interconnect 228, such as a conductive post or pillar made from copper or a conductive alloy, can be attached to the substrate 212 with the interface interconnects 224. The second interconnect 228 can be along a peripheral region of the substrate 212. The second interconnect 228 can be below the encapsulation plateau 106. The second interconnect 228 can have a second interconnect height 230. The second interconnect height 230 is greater than the first interconnect height 226.

The second contact pads 110 can be connected to the second interconnect 228 on a side facing away from the substrate 212. The second contact pads 110 can be formed from a material different from the material used to form the second interconnect 228. For example, the second contact pads 110 can be made from made from conductive materials including aluminum, nickel/silver, or silver/gold alloys.

The encapsulation 102 can be over the substrate 212 and can cover the internal interconnects 220, the integrated circuit 218, the first interconnect 222, the second interconnect 228 and the interface interconnects 224. The encapsulation recess 104 can be over the integrated circuit 218. External interconnects 232, such as solder balls or conductive bumps, can be attached to the substrate second side 216.

It has been discovered that the present invention provides an integrated circuit packaging system having improved inter-package connectivity. The first interconnect 222 and the second interconnect 228 provides higher input and output capabilities for connection to additional packages mounted over the integrated circuit packaging system while reducing the package profile. Furthermore, the first interconnect 222 and the second interconnect 228 attached to the substrate 212 with the interface interconnects 224 provides a stable and robust connection, thus improving product yield and reliability.

Figure 3:
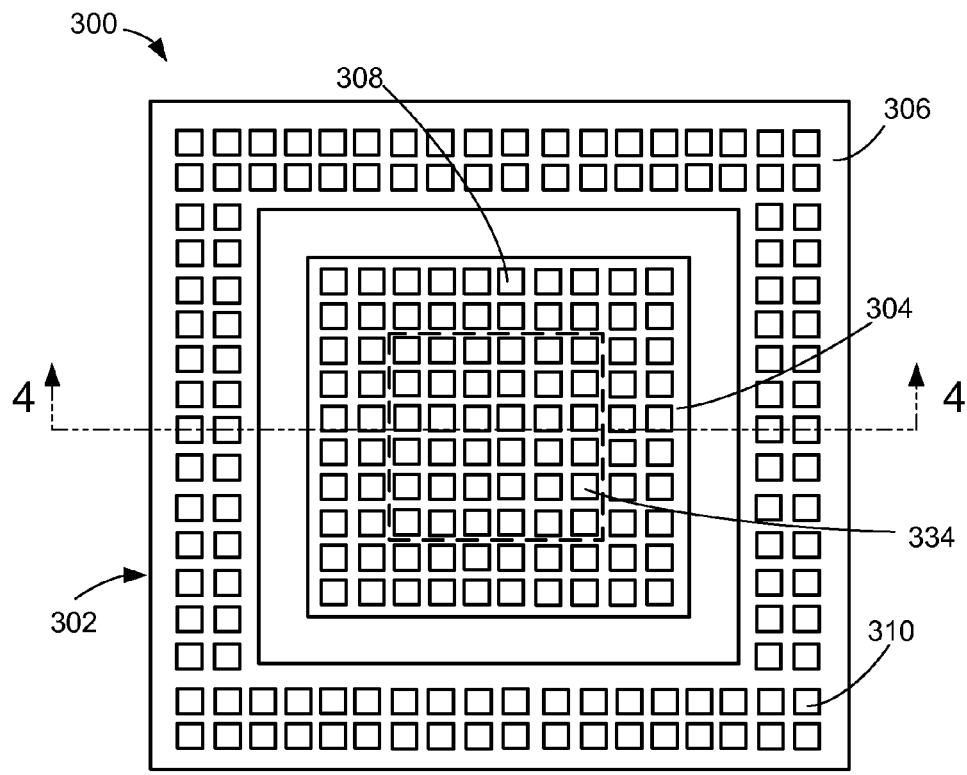
FIG. 3 is a top view of an integrated circuit packaging system in a second embodiment of the present invention.

Referring now to FIG. 3, therein is shown a top view of an integrated circuit packaging system 300 in a second embodiment of the present invention. The top view depicts an encapsulation 302, such as a cover including an epoxy molding compound a wire in film. The encapsulation 302 can include an encapsulation recess 304 and an encapsulation plateau 306. The encapsulation recess 304 can be an inner portion of the encapsulation 302. The encapsulation plateau 306 can be along a peripheral portion of the encapsulation 302. As an example, the encapsulation plateau 306 is shown surrounding the encapsulation recess 304.

Mounting pads 334, such as fan-in routed terminal pads, can be exposed from the encapsulation 302. The mounting pads 334 can be along the inner portion of the encapsulation recess 304, as depicted by the area surrounded by the dashed square.

For illustrative purposes, the integrated circuit packaging system 300 is shown having the mounting pads 334 in a grid configuration, although it is understood that the mounting pads 334 can have a different configuration. For example, the integrated circuit packaging system 300 can have the mounting pads in a checkered or staggered configuration.

First contact pads 308 can be exposed from the encapsulation 302. The first contact pads 308 can be along an outer portion of the encapsulation recess 304 and can be around the mounting pads 334. Second contact pads 310 can be exposed from the encapsulation plateau 306.

For illustrative purposes, the integrated circuit packaging system 300 is shown having the first contact pads 308 in a dual row configuration, although it is understood that the first contact pads 308 can have a different configuration. For example, the integrated circuit packaging system 300 can have the first contact pads 308 in a single row or triple row configuration. As a further example, the integrated circuit packaging system 300 can have the first contact pads 308 in a staggered configuration.

For further illustrative purposes, the integrated circuit packaging system 300 is shown having the second contact pads 310 in a dual row configuration, although it is understood that the first contact pads 308 can have a different configuration. For example, the integrated circuit packaging system 300 can have the second contact pads 310 in a single row or triple row configuration. As a further example, the integrated circuit packaging system 300 can have the second contact pads 310 in a staggered configuration.

Figure 4:
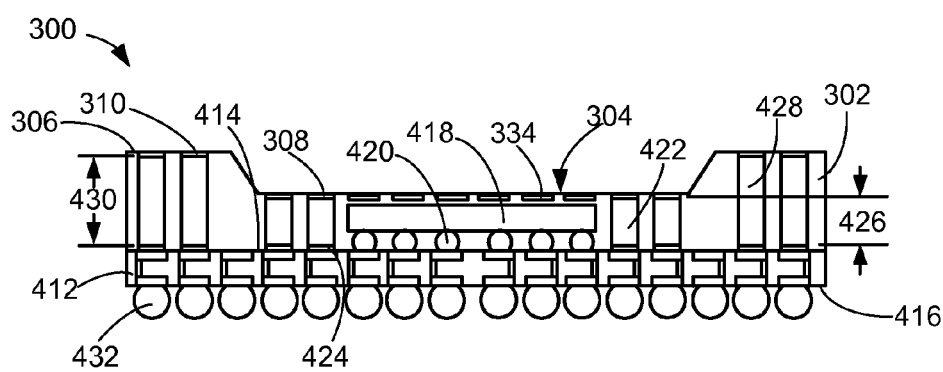
FIG. 4 is a cross-sectional view of the integrated circuit packaging system along line 4-4 of FIG. 3.

Referring now to FIG. 4, therein is shown a cross-sectional view of the integrated circuit packaging system 300 along line 4-4 of FIG. 3. The cross-sectional view depicts a substrate 412, such as a laminated substrate or a chip carrier, having a substrate first side 414 and a substrate second side 416. An integrated circuit 418, such as a flip chip or an integrated circuit die, can be mounted over the substrate first side 414. Internal interconnects 420, such as solder balls or conductive bumps, can connect the integrated circuit 418 and the substrate 412.

A first interconnect 422, such as a conductive post or pillar made from copper or a conductive alloy, can be attached to the substrate 412 with interface interconnects 424, such as a solder pad or a conductive pad. The first interconnect 422 can be adjacent to the integrated circuit 418 and below the encapsulation recess 304. The first interconnect 422 can have a first interconnect height 426.

The first contact pads 308 can be connected to the first interconnect 422 on a side facing away from the substrate 412. The first contact pads 308 can be formed from a material different from the material used to form the first interconnect 422. For example, the first contact pads 308 can be made from conductive materials including aluminum, nickel/silver, or silver/gold alloys.

A second interconnect 428, such as a conductive post or pillar made from copper or a conductive alloy, can be attached to the substrate 412 with the interface interconnects 424. The second interconnect 428 can be along a peripheral region of the substrate 412. The second interconnect 428 can be below the encapsulation plateau 306. The second interconnect 428 can have a second interconnect height 430. The second interconnect height 430 is greater than the first interconnect height 426.

The second contact pads 310 can be connected to the second interconnect 428 on a side facing away from the substrate 412. The second contact pads 310 can be formed from a material different from the material used to form the second interconnect 428. For example, the second contact pads 310 can be made from made from conductive materials including aluminum, nickel/silver, or silver/gold alloys.

The encapsulation 302 can be over the substrate 412 and can cover the internal interconnects 420, the integrated circuit 418, the first interconnect 422, the second interconnect 428 and the interface interconnects 424. The encapsulation recess 304 can be over the integrated circuit 418. External interconnects 432, such as solder balls or conductive bumps, can be attached to the substrate second side 416.

The mounting pads 334 can be exposed from the encapsulation recess 304. The mounting pads 334 can be surrounded by the first contact pads 308. The mounting pads 334 can be over the integrated circuit 418. The mounting pads 334 can be made from the same material used to make the first contact pads 308 or the second contact pads 310.

Figure 5:
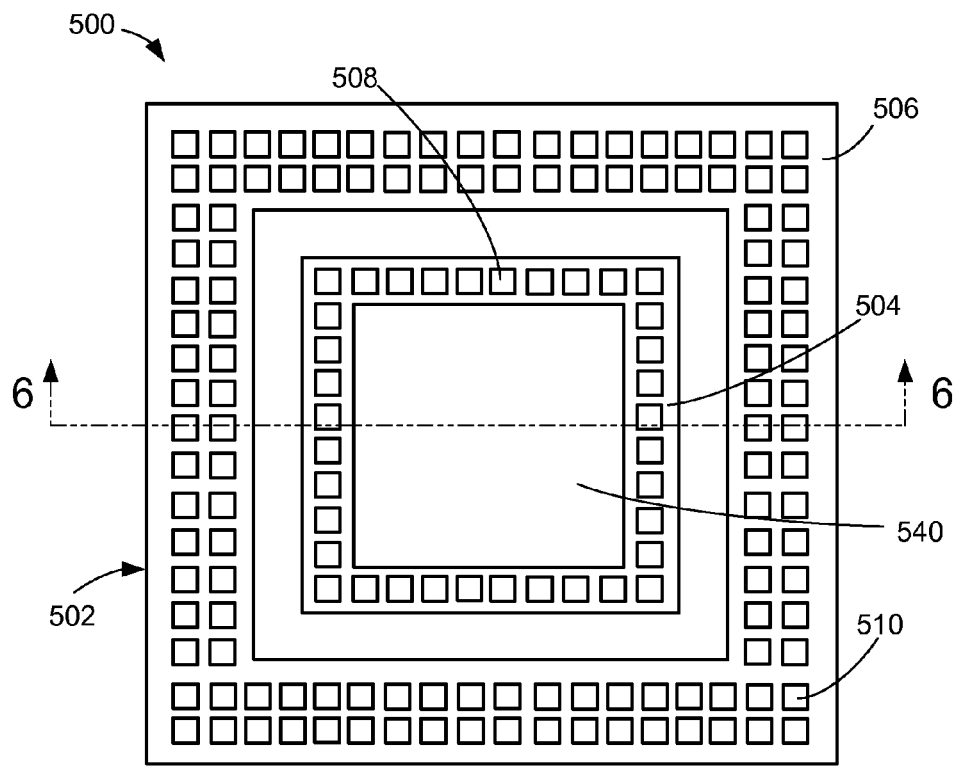
FIG. 5 is a top view of an integrated circuit packaging system in a third embodiment of the present invention.

Referring now to FIG. 5, therein is shown a top view of an integrated circuit packaging system 500 in a third embodiment of the present invention. The top view depicts an encapsulation 502, such as a cover including an epoxy molding compound a wire in film. The encapsulation 502 can include an encapsulation recess 504 and an encapsulation plateau 506. The encapsulation recess 504 can be an inner portion of the encapsulation 502. The encapsulation plateau 506 can be along a peripheral portion of the encapsulation 502. As an example, the encapsulation plateau 506 is sown surrounding the encapsulation recess 504. A conductive shield 540, such as a conductive sheet or coating, can be exposed from an inner portion of the encapsulation recess 504. The conductive shield 540 can be made from conductive materials including aluminum, nickel/silver, silver/gold alloys.

For illustrative purposes, the integrated circuit packaging system 500 is shown with the conductive shield 540 having a square shape, although it is understood that the conductive shield 540 can have a different shape. For example, the conductive shield 540 can have a rectangular shape. As a further example, the conductive shield 540 can have holes exposing the encapsulation 502 in various shapes and configurations.

For further illustrative purposes, the integrated circuit packaging system 500 is shown with the conductive shield 540 exposed from the inner portion of the encapsulation recess 504, although it is understood that the conductive shield 540 can be exposed over a different portion of the encapsulation 502. For example, the conductive shield 540 can also be exposed along the encapsulation plateau 506.

First contact pads 508 can be exposed from the encapsulation recess 504. The first contact pads 508 can be along an outer portion of the encapsulation recess 504. The first contact pads 508 can surround the conductive shield 540. Second contact pads 510 can be exposed from the encapsulation plateau 506.

For illustrative purposes, the integrated circuit packaging system 500 is shown having the first contact pads 508 in a dual row configuration, although it is understood that the first contact pads 508 can have a different configuration. For example, the integrated circuit packaging system 500 can have the first contact pads 508 in a single row or triple row configuration. As a further example, the integrated circuit packaging system 500 can have the first contact pads 508 in a staggered configuration.

For further illustrative purposes, the integrated circuit packaging system 500 is shown having the second contact pads 510 in a dual row configuration, although it is understood that the first contact pads 508 can have a different configuration. For example, the integrated circuit packaging system 500 can have the second contact pads 510 in a single row or triple row configuration. As a further example, the integrated circuit packaging system 500 can have the second contact pads 510 in a staggered configuration.

Figure 6:
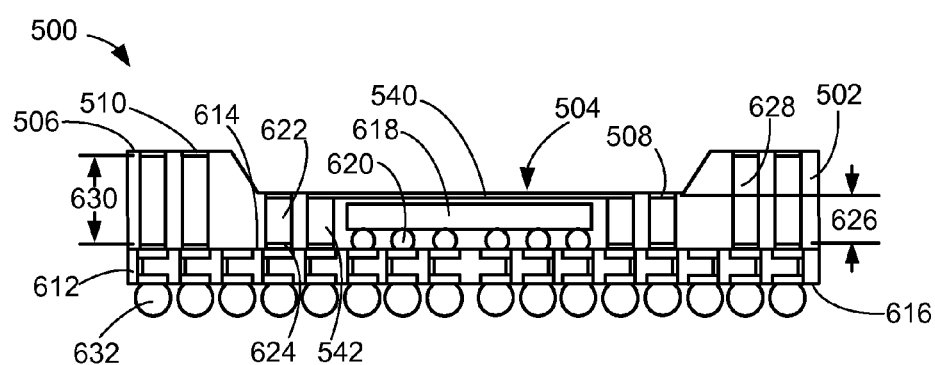
FIG. 6 is a cross-sectional view of the integrated circuit packaging system along line 6-6 of FIG. 5.

Referring now to FIG. 6, therein is shown a cross-sectional view of the integrated circuit packaging system 500 along line 6-6 of FIG. 5. The cross-sectional view depicts a substrate 612, such as a laminated substrate or a chip carrier, having a substrate first side 614 and a substrate second side 616. An integrated circuit 618, such as a flip chip or an integrated circuit die, can be mounted over the substrate first side 614. Internal interconnects 620, such as solder balls or conductive bumps, can connect the integrated circuit 618 and the substrate 612.

A ground interconnect 642, such as a conductive post or pillar made from copper or a conductive a, can be attached to the substrate 612 which can be grounded. The conductive shield 540 can be connected to the ground interconnect 642 allowing the conductive shield 540 to function as an electromagnetic interference (EMI) shield. The conductive shield 540 can be over the integrated circuit 618. The ground interconnect 642 can surround and be adjacent to the integrated circuit 618.

A first interconnect 622, such as a conductive post or pillar made from copper or a conductive alloy, can be attached to the substrate 612 with interface interconnects 624, such as a solder pad or a conductive pad. The first interconnect 622 can be below the encapsulation recess 104. The first interconnect 622 can have a first interconnect height 626.

The first contact pads 508 can be connected to the first interconnect 622 on a side facing away from the substrate 612. The first contact pads 508 can be formed from a material different from the material used to form the first interconnect 622. For example, the first contact pads 508 can be made from conductive materials including aluminum, nickel/silver, silver/gold alloys or a material similar to the material used to make the conductive shield 540.

A second interconnect 628, such as a conductive post or pillar made from copper or a conductive alloy, can be attached to the substrate 612 with the interface interconnects 624. The second interconnect 628 can be along a peripheral region of the substrate 612. The second interconnect 628 can be below the encapsulation plateau 506. The second interconnect 628 can have a second interconnect height 630. The second interconnect height 630 is greater than the first interconnect height 626.

The second contact pads 510 can be connected to the second interconnect 628 on a side facing away from the substrate 612. The second contact pads 510 can be formed from a material different from the material used to form the second interconnect 628. For example, the second contact pads 510 can be made from made from conductive materials including aluminum, nickel/silver, or silver/gold alloys or a material similar to the material used to make the conductive shield 540.

The encapsulation 502 can be over the substrate 612 and can cover the internal interconnects 620, the integrated circuit 618, the first interconnect 622, the second interconnect 628 and the interface interconnects 624. The encapsulation recess 504 can be over the integrated circuit 618. External interconnects 632, such as solder balls or conductive bumps, can be attached to the substrate second side 616.

Figure 7:
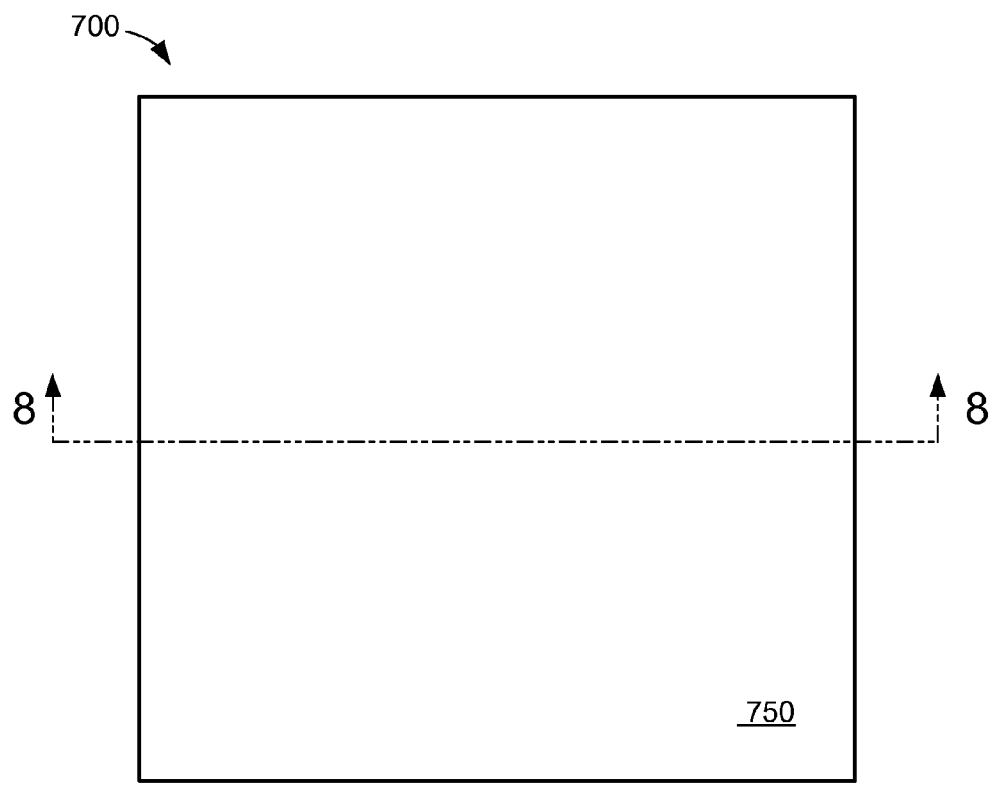
FIG. 7 is a top view of an integrated circuit package-on-package system in a fourth embodiment of the present invention.

Referring now to FIG. 7, therein is shown a top view of an integrated circuit package-on-package system 700 in a fourth embodiment of the present invention. The top view depicts a mountable structure 750, such as a packaged integrated circuit, an integrated circuit die, or a flip chip.

For illustrative purposes, the integrated circuit package-on-package system 700 is shown having a square geometric shape, although it is understood that the shape of the integrated circuit package-on-package system 700 may be different. For example, the integrated circuit package-on-package system 700 can have a rectangular shape.

Figure 8:
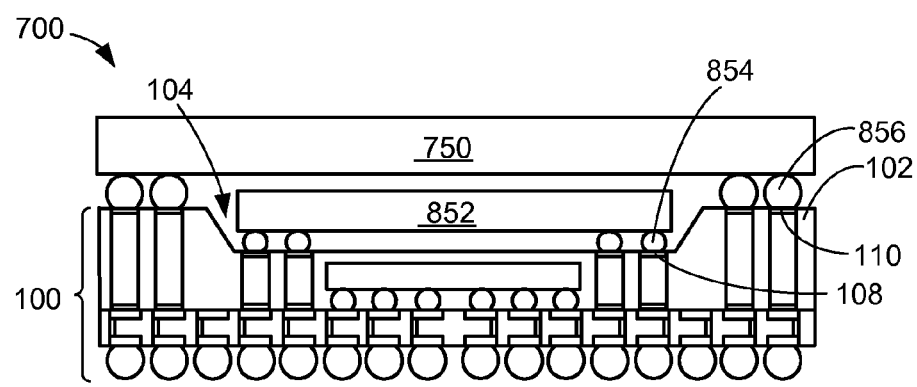
FIG. 8 is a cross-sectional view of the integrated circuit package-on-package system along line 8-8 of FIG. 7.

Referring now to FIG. 8, therein is shown a cross-sectional view of the integrated circuit package-on-package system 700 along line 8-8 of FIG. 7. The cross-sectional view depicts a device 852, such as a packaged integrated circuit, a flip chip, or a passive component, mounted over the integrated circuit packaging system 100. The device 852 can be in the encapsulation recess 104. The device 852 can be connected to the first contact pads 108 with first mounting interconnects 854, such as a solder ball, a solder bump, or a conductive bump.

The mountable structure 750 can be mounted over the integrated circuit packaging system 100 and the device 852. The mountable structure 750 can be mounted over the integrated circuit packaging system 100 with the device 852 between the encapsulation 102 of the integrated circuit packaging system 100 and the mountable structure 750. The mountable structure 750 can be connected to the second contact pads 110 with second mounting interconnects 856, such as a solder ball, a solder bump, or a conductive bump.

It has also been discovered that the present invention provides the integrated circuit package-on-package system 700 having a lower stacking height with improved connectivity. The encapsulation recess 104 allows manufacturers to stack the device 852 between the mountable structure 750 and the integrated circuit packaging system 100 thereby lowering the total height required compared to conventional multi-stacked package-on-package systems. Furthermore, the first interconnect 222 and the second interconnect 228 provide improved connectivity by increasing the number of inputs and outputs to the device 852 and the mountable structure 750.

Figure 9:
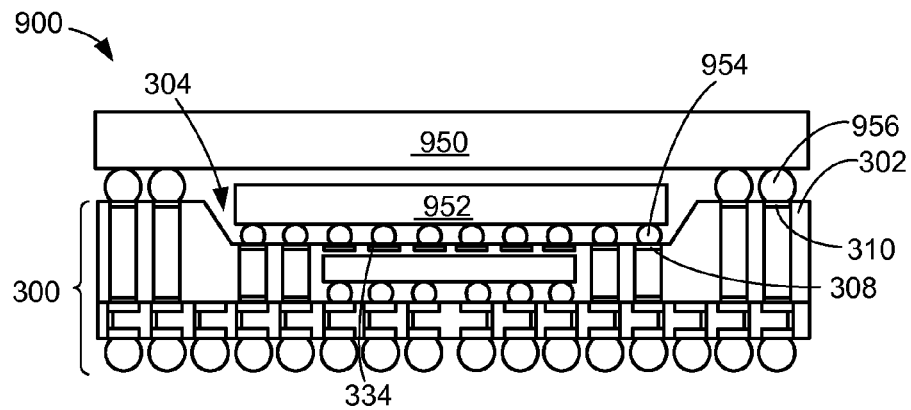
FIG. 9 is a cross-sectional view of an integrated circuit package-on-package system along line 8-8 of FIG. 7 in a fifth embodiment of the present invention.

Referring now to FIG. 9, therein is shown a cross-sectional view of an integrated circuit package-on-package system 900 along line 8-8 of FIG. 7 in a fifth embodiment of the present invention. The cross-sectional view depicts a device 952, such as a packaged die attached paddle with the paddle exposed, a packaged integrated circuit, a flip chip, or a passive component, mounted over the integrated circuit packaging system 300. The device 952 can be in the encapsulation recess 304. The device 952 can be connected to the first contact pads 308 and the mounting pads 334 with first mounting interconnects 954, such as a solder ball, a solder bump, or a conductive bump.

A mountable structure 950, such as a packaged integrated circuit, an integrated circuit die, or a flip chip, can be mounted over the integrated circuit packaging system 300 and the device 952. The mountable structure 950 can be mounted over the integrated circuit packaging system 300 with the device 952 between the encapsulation 302 of the integrated circuit packaging system 300 and the mountable structure 950. The mountable structure 950 can be connected to the second contact pads 310 with second mounting interconnects 956, such as a solder ball, a solder bump, or a conductive bump.

Figure 10:
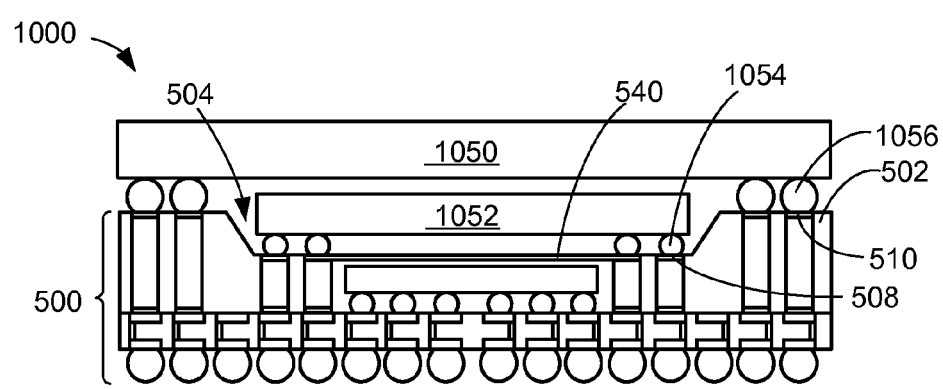
FIG. 10 is a cross-sectional view of an integrated circuit package-on-package system along line 8-8 of FIG. 7 in a sixth embodiment of the present invention.

Referring now to FIG. 10, therein is shown a cross-sectional view of an integrated circuit package-on-package system 1000 along line 8-8 of FIG. 7 in a sixth embodiment of the present invention. The cross-sectional view depicts a device 1052, such as a packaged die attached paddle with the paddle exposed, a packaged integrated circuit, a flip chip, or a passive component, mounted over the integrated circuit packaging system 500. The device 1052 can be in the encapsulation recess 504. The device 1052 can be connected to the first contact pads 508 and the conductive shield 540 with first mounting interconnects 1054, such as a solder ball, a solder bump, or a conductive bump.

A mountable structure 1050, such as a packaged integrated circuit, an integrated circuit die, or a flip chip, can be mounted over the integrated circuit packaging system 500 and the device 1052. The mountable structure 1050 can be mounted over the integrated circuit packaging system 500 with the device 1052 between the encapsulation 502 of the integrated circuit packaging system 500 and the mountable structure 1050. The mountable structure 1050 can be connected to the second contact pads 510 with second mounting interconnects 1056, such as a solder ball, a solder bump, or a conductive bump.

Figure 11:
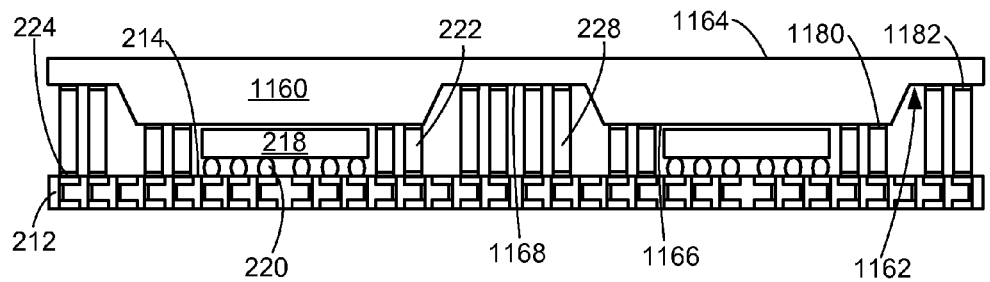
FIG. 11 is a cross-sectional view of a carrier in a mounting phase of the carrier to the substrate.

Referring now to FIG. 11, therein is shown a cross-sectional view of a carrier 1160 in a mounting phase of the carrier 1160 to the substrate 212. The carrier 1160, such as a structure including copper, other metals, alloys or conductive materials, can have a carrier first side 1162 and a carrier second side 1164. The carrier 1160 can have a planar surface 1166 and a cavity 1168 therein along the carrier first side 1162.

The first interconnect 222 can be connected to the carrier 1160 along the carrier first side 1162. The first interconnect 222 can be connected along the planar surface 1166 of the carrier first side 1162. As an example, the carrier 1160 is shown with the first interconnect 222 perpendicular to the carrier first side 1162.

A first barrier 1180 can be along the planar surface 1166 of carrier first side 1162. As an example, the first barrier 1180 can function as an etching protection layer, an adhesion layer, a buffer diffusion barrier layer, a wet-enhancing layer, or a combination thereof. The first barrier 1180 can be between and connect the carrier first side 1162 and the first interconnect 222. The first barrier 1180 can connect the portion of the first interconnect 222 facing the carrier 1160 and the planar surface 1166 of the carrier 1160.

The second interconnect 228 can be connected to the carrier 1160 along the carrier first side 1162. The second interconnect 228 can be connected to the carrier 1160 in the cavity 1168. As an example, the carrier 1160 is shown with the second interconnect 228 perpendicular to the carrier first side 1162. The side of the first interconnect 222 facing away from the carrier 1160 can be co-planar with the side of the second interconnect 228 facing away from the carrier 1160.

A second barrier 1182 can be in the cavity 1168 of carrier first side 1162. As an example, the second barrier 1182 can function as an etching protection layer, an adhesion layer, a buffer diffusion barrier layer, a wet-enhancing layer, or a combination thereof. The second barrier 1182 can be between and connect the carrier first side 1162 and the second interconnect 228. The second barrier 1182 can connect the portion of the second interconnect 228 facing the carrier 1160 and the carrier first side 1162 in the cavity 1168.

The integrated circuit 218 can be mounted over the substrate first side 214. The integrated circuit 218 can be connected to the substrate first side 214 with the internal interconnects 220.

The carrier 1160, can be mounted over the substrate 212 and the integrated circuit 218 with the carrier first side 1162 facing the substrate first side 214 and the planar surface 1166 over the integrated circuit 218. As an example, the planar surface 1166 is shown not contacting the integrated circuit 218.

The first interconnect 222 and the second interconnect 228 can be attached to the substrate first side 214. The carrier 1160 can be mounted over the substrate first side 214 with the first interconnect 222 adjacent to the integrated circuit 218. Similarly, the first interconnect 622 of FIG. 6 can include the ground interconnect 642 of FIG. 6. The ground interconnect 642 can be attached to and grounded with the substrate 612 of FIG. 6.

The first interconnect 222 and the second interconnect 228 can be connected to the substrate first side 214 with the interface interconnects 224. The interface interconnects 224 can be formed in a number of different ways. For example, the side of the first interconnect 222 and the side of the second interconnect 228 facing away from a carrier first side 962 can be coated with a conductive material, such as solder, a metal, or a conductive alloy, by a process including hot or wave pot dipping prior to attachment to the substrate first side 214. As a further example, conductive material can be coated on the substrate first side 214 by a process including screen printing or solder dripping prior to attachment of the first interconnect 222 and the second interconnect 228. As a final example, the interface interconnects 224 can be formed by a combination of the previously described methods.

Figure 12:
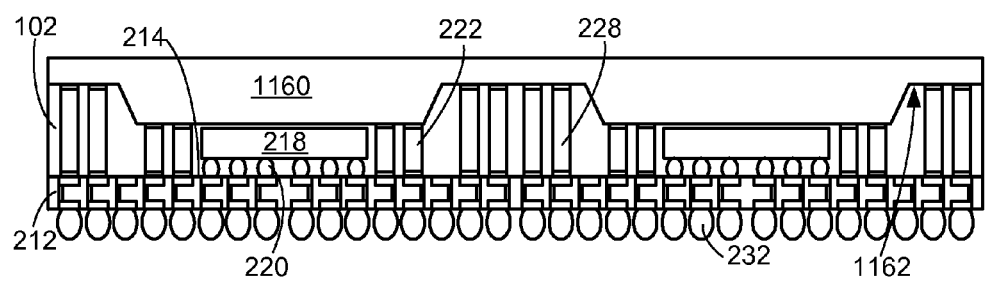
FIG. 12 is the structure of FIG. 11 in a molding phase of the carrier with the substrate.

Referring now to FIG. 12, therein is shown the structure of FIG. 11 in a molding phase of the carrier 1160 with the substrate 212. The encapsulation 102 of FIG. 1 can be formed between the carrier 1160 and the substrate 212. The encapsulation 102 can be over the substrate first side 214 and can cover the integrated circuit 218, the internal interconnects 220, the first interconnect 222, the second interconnect 228, and the interface interconnects 224. The encapsulation 102 can have the encapsulation recess 104 under the planar surface 1166 and over the integrated circuit 218. The external interconnects 232 of FIG. 2 can be attached to the substrate second side 216.

Figure 13:
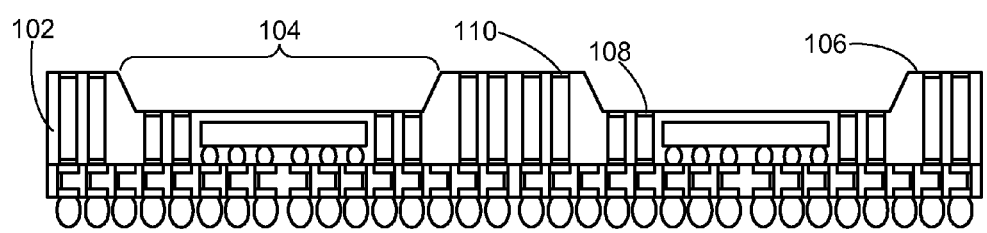
FIG. 13 is the structure of FIG. 12 in a removing phase of the carrier of FIG. 11.

Referring now to FIG. 13 therein is shown the structure of FIG. 12 in a removing phase of the carrier 1160 of FIG. 11. The carrier 1160 of FIG. 11 can be removed to expose the encapsulation 102. Removal of the planar surface 1166 of FIG. 11 can expose the encapsulation recess 104. Removal of the cavity 1168 of FIG. 11 can expose the encapsulation plateau 106.

Removal of the carrier 1160 can remove a portion of the first barrier 1180 and the second barrier 1182. The removal of the carrier 1160 can form the first contact pads 108 from the first barrier 1180 of FIG. 11. The removal the carrier 1160 can form the second contact pads 110 from the second barrier 1182 of FIG. 11.

Similarly, removal of the carrier 1160 can remove a portion of the first barrier 1180 forming the mounting pads 334 of FIG. 3. As a further example, removal of the carrier 1160 can expose the conductive shield 540 of FIG. 5. The first barrier 1180 can extend between the ground interconnect 642 of FIG.

6 and a further of the ground interconnect 642. The first barrier 1180 can be over the integrated circuit 618. Removal of the carrier 1160 can form the conductive shield 540 from the first barrier 1180.

The first contact pads 108 and second contact pads 110 can have the characteristics of the carrier 1160 removed. The characteristics of the carrier 1160 removed can include physical features, such as an etched surface, chemical residue, or a chemically processed surface. The first contact pads 108 and the second contact pads 110 can protect the first interconnect 222 and the second interconnect 228, respectively, from removal by the method used to remove the carrier 1160.

The carrier 1160 can be removed by a number of different methods. For example, the carrier 1160 can be removed by chemical etching or stripping.

Figure 14:
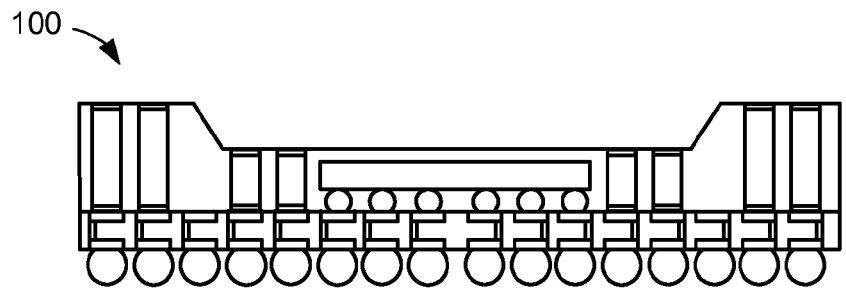
FIG. 14 is the structure of FIG. 13 in a forming the integrated circuit packaging system of FIG. 1.

Referring now to FIG. 14, therein is shown the structure of FIG. 13 in forming the integrated circuit packaging system 100 of FIG. 1. The structure of FIG. 13 can be singulated to form the integrated circuit packaging system 100.

The structure of FIG. 13 can be singulated by a number of different methods. For example, the structure of FIG. 13 can be singulated sawing or laser cutting.

Figure 15:
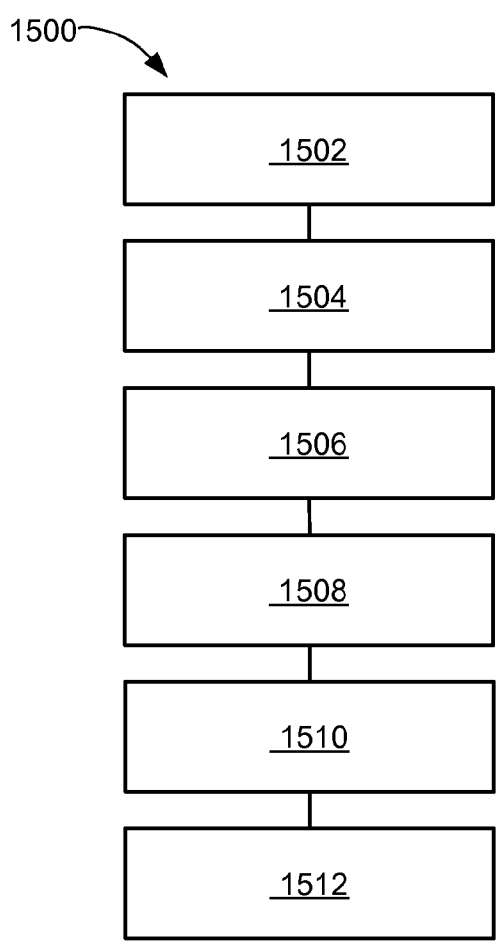
FIG. 15 is a flow chart of a method of manufacture of an integrated circuit packaging system in a further embodiment of the present invention.

Referring now to FIG. 15, therein is shown a flow chart of a method 1500 of manufacture of the integrated circuit packaging system 100 in a further embodiment of the present invention. The method 1500 includes providing a carrier having a planar surface and a cavity therein, a first barrier between the planar surface and a first interconnect, and a second barrier between the cavity and a second interconnect in a block 1502; providing a substrate in a block 1504; mounting an integrated circuit over the substrate in a block 1506; mounting the carrier to the substrate with the first interconnect and the second interconnect attached to the substrate and with the planar surface over the integrated circuit in a block 1508; forming an encapsulation between the substrate and the carrier covering the integrated circuit, the encapsulation having an encapsulation recess under the planar surface and over the integrated circuit in a block 1510; and removing a portion of the carrier to expose the encapsulation, a portion of the first barrier to form a first contact pad, and a portion of the second barrier to form a second contact pad in a block 1512.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
    a substrate;
    an integrated circuit over the substrate;
    a first interconnect attached to the substrate;
    a second interconnect attached to the substrate;
    an encapsulation having an encapsulation recess and an encapsulation plateau covering the first interconnect, the second interconnect, and the integrated circuit with the encapsulation recess over the integrated circuit, the first interconnect under the encapsulation recess, and the second interconnect under the encapsulation plateau;
    a first contact pad exposed along the encapsulation recess and attached to the first interconnect; and
    a second contact pad exposed along the encapsulation plateau and attached to the second interconnect.

2. The system as claimed in claim 1 further comprising a mounting pad exposed from an inner portion of the encapsulation recess.

3. The system as claimed in claim 1 further comprising:
    a ground interconnect attached to the substrate and adjacent to the integrated circuit; and
    a conductive shield exposed from the encapsulation with the conductive shield over the integrated circuit and connected to the ground interconnect and the ground interconnect grounded.

4. The system as claimed in claim 1 further comprising a device connected to the first contact pad with the device in the encapsulation recess.

5. The system as claimed in claim 1 further comprising a mountable structure connected to the second contact pad with mountable structure over the encapsulation plateau.

6. The system as claimed in claim 1 wherein:
    the substrate includes a substrate first side and a substrate second side;
    the integrated circuit is mounted over the substrate first side; and
    the first interconnect is adjacent to the integrated circuit.

7. The system as claimed in claim 6 further comprising:
    a device connected to the first contact pad with the device in the encapsulation recess; and
    a mountable structure connected to the second contact pad with the device between the mountable structure and the encapsulation.

8. The system as claimed in claim 6 further comprising an interface interconnect between the first interconnect and the substrate, and between the second interconnect and the substrate.

9. The system as claimed in claim 6 wherein the first contact pad and the second contact pad have the characteristics of a carrier removed by etching.

10. The system as claimed in claim 6 wherein the integrated circuit includes a flip-chip.

* * * * *